(12) United States Patent
Tran et al.

(10) Patent No.: US 9,302,912 B2
(45) Date of Patent: Apr. 5, 2016

(54) COMPACT, CONFIGURABLE POWER SUPPLY FOR ENERGIZING OZONE-PRODUCING CELLS

(75) Inventors: Ken Tran, North Chelmsford, MA (US); Feng Tian, Salem, NH (US); Xing Chen, Lexington, MA (US); Franklin Lee, Framingham, MA (US)

(73) Assignee: MKS Instruments, Inc., Andover, MA (US)

( * ) Notice: Subject to any disclaimer, the term of this patent is extended or adjusted under 35 U.S.C. 154(b) by 1014 days.

(21) Appl. No.: 13/432,415

(22) Filed: Mar. 28, 2012

(65) Prior Publication Data

US 2013/0257301 A1    Oct. 3, 2013

(51) Int. Cl.
*H05B 37/00* (2006.01)
*C01B 13/11* (2006.01)

(52) U.S. Cl.
CPC .................................. *C01B 13/115* (2013.01)

(58) Field of Classification Search
None
See application file for complete search history.

(56) References Cited

U.S. PATENT DOCUMENTS

| | | | |
|---|---|---|---|
| 7,206,210 B2 | 4/2007 | Harnett et al. | |
| 7,353,771 B2 | 4/2008 | Millner et al. | |
| 7,616,462 B2 | 11/2009 | Millner et al. | |
| 8,817,509 B2 * | 8/2014 | Taniguchi et al. | 363/95 |
| 2005/0199484 A1 * | 9/2005 | Olstowski | 204/176 |
| 2005/0219875 A1 | 10/2005 | Millner et al. | |
| 2007/0108040 A1 | 5/2007 | Elkin et al. | |
| 2008/0316773 A1 | 12/2008 | Neubarth et al. | |

FOREIGN PATENT DOCUMENTS

| | | |
|---|---|---|
| CN | 101288219 | 10/2008 |
| EP | 1708351 A2 | 10/2006 |
| WO | 2007035216 A1 | 3/2007 |

OTHER PUBLICATIONS

Ordiz, C. et al., "Development of a high-voltage closed-loop power supply for ozone Generation", Applied Power Electronics Conference and Exposition, 2008 APEC 2008. 23rd Annual IEEE, IEEE, Piscataway, NJ, USA, Feb. 24, 2008, pp. 1861-1867, XP031253506.
English-language translation of First Office Action from corresponding Chinese Application No. 201380022479.2, filed Mar. 19, 2013.

* cited by examiner

*Primary Examiner* — Cassandra Cox
(74) *Attorney, Agent, or Firm* — Burns & Levinson, LLP; Steven M. Mills

(57) ABSTRACT

Improvements in the supply of high-frequency electrical power to ozone-producing cells can be accomplished using the systems and techniques described herein. Application of a DC-DC converter operating at a switching frequency substantially greater than a load frequency, supports generation of a high-voltage AC for powering such cells, while allowing for reductions in component size and reductions in a quality factor of a load tuning circuit. Controllable power inverters used in obtaining one or more of the switching and load frequencies can be controlled using feedback techniques to provide stable, high-quality power to ozone-producing cells under variations in one or more of externally supplied power and load conditions. An inrush protection circuit can also be provided to selectively introduce a current-limiting resistance until an input DC bus has been sufficiently initialized as determined by measurements obtained from the DC bus. The current limiting resistance can be a positive-temperature coefficient thermistor.

26 Claims, 10 Drawing Sheets

COMPACT, CONFIGURABLE POWER SUPPLY FOR ENERGIZING OZONE-PRODUCING CELLS

TECHNICAL FIELD

This application relates generally to power conversion and more particularly to power conversion for igniting plasma in a reactive gas generator.

BACKGROUND

Ozone is useful for numerous applications that require a high level of oxidation. For example, ozone is useful for disinfection of drinking water and has been used for water treatment since the early 1900's. More recently, ozone has been used for semiconductor device processing. One application for ozone in semiconductor device processing is forming insulating layers on semiconductor wafers by growing insulating films or by oxidizing thin films on the wafer, for example, high deposition rate chemical vapor deposition of high quality $SiO_2$ can be accomplished by using a TEOS/ozone processor.

Another application for ozone in semiconductor device processing is for cleaning semiconductor wafers and equipment. Ozone is particularly useful for removing hydrocarbons from the surface of semiconductor wavers or from processing chambers. Using ozone for cleaning is advantageous because it avoids the use of dangerous chemicals, which require costly disposal. In contrast, ozone does not present a toxic waste disposal problem because ozone decays to oxygen without residues.

An ozone generator includes one or more individual ozone generating units, also referred to herein as ozone-producing cells. Each ozone-producing cell typically includes opposing electrode plates and a dielectric barrier. The dielectric barrier can be positioned against one of the electrode plates, forming a channel between the dielectric barrier and the opposing electrode plate. In operation, oxygen ($O_2$) is provided to the cell and allowed to pass through the channel, whereupon it is acted upon by an electrical discharge between the electrode plates causing the dissolution and recombination of at least a portion of the oxygen atoms into ozone ($O_3$) molecules.

To cause the electrical discharge or flux (i.e., ignite a plasma), high voltage AC power is applied across the opposing electrode plates of each ozone-producing cell. It has been determined that applying an AC load voltage of about 8 kilovolts, peak-to-peak at a relatively high frequency of between about 30 kHz and about 40 kHz is preferred for operation of at least some such ozone-producing cells. Since most applications derive such cell driving voltages from facility prime power, the ozone cell power system necessarily increases or otherwise steps up the voltage level from a facility power level (e.g., 208 volt AC, or 480 volt AC three-phase power). Additionally, the power system necessarily increases the frequency from a relatively low value of the facility supplied power (e.g., 50/60 Hz) to a relatively high value of the preferred frequency of operation.

The ozone-producing cell can be modeled as a capacitor in parallel with a series combination of a resistor and a bi-polar transient voltage suppressor. Application of electrical power can be hampered by the relatively large reactive load impedance resulting from the capacitor of the ozone cell. Electrical loads having such large reactive components tend to result in substantial heat loss and otherwise stress components of the power supply. Such components operate at increased power levels necessary to deliver suitable usable power (i.e., not reactive) to the load.

SUMMARY

It would be desirable to provide a compact power system configured for efficiently providing power to one or more ozone-producing cells. Furthermore, in either instance, it would be desirable to achieve flexibility in having a common such compact power system that is easily adjustable or otherwise configurable for ozone-producing applications requiring different power requirements. Still further, it would be desirable to provide an increased measure of protection to such power systems during initialization to protect against damage that might otherwise result from uncontrolled inrush current.

Described herein are devices and techniques to attain one or more of reducing a size of a power system for supplying power to one or more ozone-producing cells, providing flexibility in adjusting such power systems for different power ratings, and providing in-rush current protection.

In one aspect, at least one embodiment described herein provides a process for supplying power to at least one ozone-producing cell. The process includes receiving an unregulated DC voltage, switching the unregulated DC voltage at a first switching frequency, and converting the switched DC voltage to a regulated, DC high-voltage, substantially greater than the unregulated DC voltage. The process further includes switching the DC high-voltage at a second switching frequency within a preferred operating frequency range of the at least one ozone-producing cell and coupling the switched DC high-voltage to the at least one ozone-producing cell through a series inductance. The series inductance forms together with an internal capacitance of the at least one ozone-producing cell, a resonance adapted to subject the at least one ozone-producing cell to a narrow-band, AC high-voltage within the preferred operating frequency range of the ozone-producing cell.

In another aspect, at least one embodiment described herein provides a power converter for energizing at least one ozone-producing cell. The power converter includes a DC-to-DC converter having an input configured to receive an unregulated DC voltage and an output configured to provide a regulated DC high voltage derived from the unregulated DC voltage. In particular, the DC high voltage has an amplitude substantially greater than an amplitude of the unregulated DC voltage. The power converter also includes a high-frequency power inverter having an input in communication with the output of the DC-to-DC converter. The high-frequency power inverter is configured to provide at an output a high-frequency AC voltage derived from the DC high voltage. A series inductance is coupled between the output of the high-frequency power inverter and at least one ozone-producing cell. The series inductance forms, together with an internal capacitance of the at least one ozone-producing cell, a resonance in the high-frequency AC voltage occurring within a preferred operating frequency range of the at least one ozone-producing cell.

In at least some embodiments, the power converter includes a first controller having a sensing input receiving an indication of the DC high voltage output of the DC-to-DC converter, a reference input configured to receive an indication of a target DC high voltage, and a controlling output in communication with the DC-to-DC converter. The first controller is configured to adjust operation of the DC-to-DC converter responsive to the target DC high voltage and an indication of the DC high-voltage received at the sensing input. The power converter also includes a second controller having a sensing input configured to receive an output indication of at least one of a load voltage and a load current supplied to the at least one ozone-producing cell, a reference power input configured to receive an indication of operating load power, and a controlling output in communication with the high frequency power inverter. The second controller is configured to adjust operation of the high-frequency power inverter responsive to the received indication of operating load power and an indication of the at least one of the load voltage and the load current.

In another aspect, at least one embodiment described herein provides a process for supplying power to at least one ozone-producing cell. The process includes converting an unregulated DC voltage to a regulated DC high voltage having an amplitude substantially greater than an amplitude of the unregulated DC voltage. Conversion of the unregulated DC voltage to the regulated DC high voltage is controlled responsive to a DC high voltage reference input. The DC high voltage is converted to a high-frequency AC voltage. Conversion of the DC high voltage to the high-frequency AC voltage is controlled responsive to a load power reference input, such that electrical power delivered by the high-frequency AC voltage, when applied through a series inductance to at least one ozone-producing cell, corresponds to the load power reference input.

In another aspect, at least one embodiment described herein provides a power converter for powering at least one ozone-producing cell. The power converter includes a rectifier configured to rectify an AC input voltage and a bus capacitor coupled in parallel to the rectifier. The bus capacitor is configured to develop an unregulated DC voltage in response to rectified AC input voltage. The power converter also includes first and second sensors and a power converter coupled to the bus capacitor and configured to produce a high-frequency AC output voltage in response to the unregulated DC voltage, when coupled to at least one ozone-producing cell. The first sensor is configured to measure a voltage across the bus capacitor, and the second sensor is configured to measure a current between the rectifier and the bus capacitor. The power converter further includes a controllable current-limiting resistance coupled between the rectifier and the bus capacitor. The controllable current limiting resistance is also in communication with each of the first and second sensors and configured to provide a current limiting resistance during initialization and a substantial short circuit once initialized.

In yet another aspect, at least one embodiment described herein provides a process for supplying power to at least one ozone-producing cell. The process includes rectifying an AC input voltage, charging by the rectified AC input voltage a bus capacitor to a DC operating voltage, and converting the DC operating voltage to a high-frequency AC voltage when applied to at least one ozone-producing cell. The process further includes differentiating between an initialization state of the bus capacitor and an initialized state of the bus capacitor, and varying a series resistance in response to the measured voltage and current. The series resistance limits current to the bus capacitor during initialization, otherwise allowing unrestricted current when initialized.

BRIEF DESCRIPTION OF THE DRAWINGS

The present disclosure is further described in the detailed description which follows, in reference to the noted plurality of drawings by way of non-limiting examples of embodiments of the present disclosure, in which like reference numerals represent similar parts throughout the several views of the drawings, and wherein.

DESCRIPTION OF THE PREFERRED EMBODIMENTS

In the following detailed description of the preferred embodiments, reference is made to accompanying drawings, which form a part thereof, and within which are shown by way of illustration, specific embodiments, by which the disclosure may be practiced. It is to be understood that other embodiments may be utilized and structural changes may be made without departing from the scope of the disclosure.

The particulars shown herein are by way of example and for purposes of illustrative discussion of the embodiments of the present disclosure only and are presented in the case of providing what is believed to be the most useful and readily understood description of the principles and conceptual aspects of the present disclosure. In this regard, no attempt is made to show structural details of the present disclosure in more detail than is necessary for the fundamental understanding of the present disclosure, the description taken with the drawings making apparent to those skilled in that how the several forms of the present disclosure may be embodied in practice. Further, like reference numbers and designations in the various drawings indicate like elements.

Described herein are devices and techniques for providing power to at least one ozone-producing cell.

Figure 1:
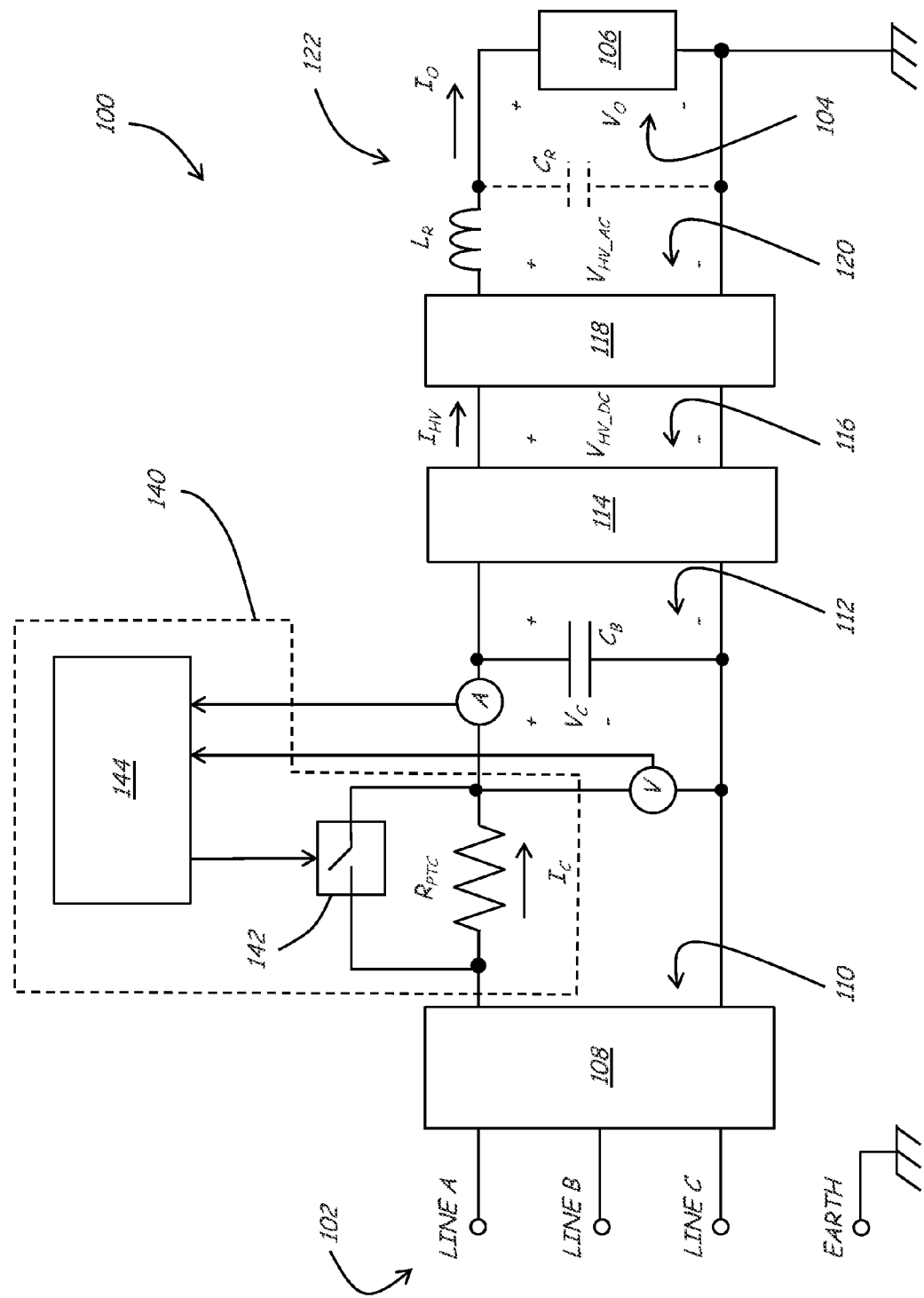
FIG. 1 shows a schematic diagram of an embodiment of a compact ozone power system with inrush current protection.

A schematic diagram of an embodiment of a compact ozone power system 100 is illustrated in FIG. 1. In general, the power system 100 receives electrical power from an external power source 102, such as facility-provided power mains, and converts the externally supplied power to a load power 104, suitable for operating one or more reactive gas generators, such as ozone-producing cells 106. For example, the external power source 102 can be utility-provided 50/60 Hz, 208 Volt, three-phase AC power (e.g., having LINE A, LINE B, LINE C and a ground or EARTH reference). As such utility provided power may vary from time to time, the power system 100 is preferably adapted to provide an intended load power under variations in the eternal source 102, for example, ranging from about +/−10% (e.g., from about 180 to about 230 volts AC). The power system 100 can be configured to accommodate other power mains, such as 480 Volt AC, similarly operating over a specified range about the nominal voltage of 480 volts AC (e.g., from about 430 to about 530 volts AC).

In general the external power source 102 and the converted power supplied to the ozone-producing cells 106 can have any of various voltages, currents and frequencies, depending upon the external power 102 and requirements of the cells 106. In at least some embodiments, electrical load power 104 supplied to the ozone-producing cell 106 includes a peak-to-peak AC voltage of about 8 kilovolts, at a frequency of between about 20 kHz and about 40 kHz. It is understood that different voltages and frequencies can be supplied as may be appropriate for operating one or more ozone-producing cells.

For applications in which externally supplied power 102 is AC, the power system 100 includes a rectifier module 108 for first converting the externally supplied AC power to DC. In the illustrative example in which the externally supplied power 102 is three-phase AC, the power system 100 includes a three-phase rectifier module 108 for receiving the input AC power 102 and providing a rectified output 110. The rectified output 110 is coupled across a filter capacitor, also referred to as a bus capacitor $C_B$, configured to smooth the rectified output 110 to more closely approximate a DC voltage for powering a DC bus 112. In the illustrative example, the DC bus 112 is unregulated, operating at a relatively low-voltage in comparison to other portions of the power system 100.

Although not shown, it is understood that a front end of the power system 100, including the rectifier 108 and bus capacitor $C_B$, can also include one or more main AC fuses (not shown), e.g., one for each line to protect against catastrophic failure during any abnormal operations, and an electromagnetic interference (EMI) filter (also not shown). Such EMI filters are commonly provided in electronic circuitry, for example, to prevent any would be electrical interference generated by the power system 100 from being conducted back onto the power mains 102. Still further, it is understood that the power system 100 can include one or more biasing power supplies (not shown), as may be useful in powering electronic circuitry used in operation of the power system 100. Such biasing power supplies can be powered by the input power mains 102, including one, two or all three legs for three-phase power 102. In particular, by connecting the bias power 102 directly to all three legs of three-phase power 102, the need for a bulky hold-up capacitor as would otherwise be required to accommodate Semi-F47 events is alleviated. Alternatively or in addition, such a biasing power supply can be powered by the DC bus 112.

The power system 100 also includes at least one power converter 114 having an input coupled to the low-voltage, unregulated DC bus 112. In at least some embodiments, the power converter can be configured as a DC-to-DC converter, providing an output that is also a DC voltage, but having a different value from the low-voltage, unregulated DC bus 112. For example, the power converter 114 can be configured to step up (i.e., increase) the relatively low voltage of the low-voltage, unregulated DC bus 112 to a relatively high, regulated DC voltage. An output of the power converter 114 can be coupled to a high-voltage, regulated DC bus 116. Since ozone producing cells 106 generally require an operating voltage that is substantially greater than that supplied by the power mains 102, any increase provided by the power converter 114 is helpful in meeting the load requirements and in relaxing design constraints of a back end portion of the power system 100. In at least some embodiments, a voltage of the regulated DC bus 116 is substantially greater than a voltage of the low-voltage, unregulated DC bus 112 (e.g., between about 200-350 volts DC). Example operating voltages $V_{HV\_DC}$ of the high-voltage, regulated DC bus 116 can be between about 1 kilovolt and about 2 kilovolts or greater.

The power system 100 further includes a power inverter 118, with an input coupled to the high-voltage, regulated DC bus 116. The power inverter 118 converts a voltage of the high-voltage, regulated DC bus 116 into a relatively high-frequency AC output voltage 120. The relatively high-frequency AC output 120 is coupled to a resonant or tank circuit 122, formed by at least one resonant series inductor $L_R$ and the one or more ozone-producing cells 106. The series inductance $L_R$, together with an internal capacitance of the one or more ozone-producing cells 106, forms a resonance in the high-frequency AC voltage occurring within a preferred operating frequency range of the at least one ozone-producing cell. A resonant frequency $f_0$ of a series L-C resonator as can be formed by the series inductance $L_R$ and the internal capacitance $C_{EQ}$ (not shown) of the ozone-producing cells 106 can be expressed as $$f_0 = \frac{1}{2\pi\sqrt{L_R C_{EQ}}} \qquad \text{Eqn. 1}$$

In at least some embodiments, relatively high-frequency AC output 120 $V_{HV\_AC}$ approximates a square wave, for example, resulting from switching operation of the power inverter 118. The resonance of the tank circuit 122 can be adjusted by selecting an inductance of the series inductor $L_R$ that in combination with the equivalent internal capacitance $C_{EQ}$ of the one or more ozone-producing cells 106, to establish a resonant frequency $f_0$ and to determine a corresponding quality factor, or "Q." By filtering the relatively high voltage AC output 120 of the power inverter 118 (e.g., a switched 1 or 2 kilovolt rectangular wave), it is possible to operate with a tank circuit 122 having a Q of less than about 5. In some embodiments, a Q of about 3 or 4 can be sufficient. Selectivity of the tank circuit 122 represented by the Q value, can reject certain portions of a frequency spectrum of the approximate square wave AC output 120. Thus, by suitable adjustment of a switching frequency of the power inverter 118 and a resonant or center frequency $f_0$ and Q of the tank circuit 122, it is possible to produce a substantially sinusoidal AC voltage $V_0$, for delivery to the one or more ozone-producing cells 106. For example, the power inverter 118 in combination with the tank circuit 122 can produce a sine wave having a frequency of between about 20 kHz and about 40 kHz, and a voltage amplitude of about 8 kilovolts peak-to-peak, in response to a 1 kilovolt DC input.

In at least some embodiments, the tank circuit 122 is further tuned to reduce a reactive power component. For example, the inductance value of the series inductance $L_R$ can be selected, such that a series reactance of the inductor $L_R$, effectively cancels a reactance of an equivalence series capacitance of the one or more ozone-producing cells 106 within an intended frequency operating range (e.g., between about 20 kHz and about 40 kHz). It is generally desirable, however, for the compact ozone power system 100 to accommodate a variable number of ozone-producing cells 106, sometimes referred to as an ozone-producing cell "stack." Accordingly, an equivalent internal capacitance $C_{EQ}$ of the one or more ozone-producing cells 106 depends upon the particular number of ozone-producing cells 106 combined in a given cell stack.

An equivalent capacitance of such a stack of ozone-producing cells 106 can be determined, for example, as a parallel combination of the individual equivalent capacitance of each ozone-producing cell 106 in the stack. There will typically be some maximum number of cells 106 that the power system 100 can accommodate. For example, an equivalence capacitive load of an example ozone cell is about 1 nanofarad. A 5 kilowatt power system 100 can power up to about fourteen such ozone cells. A determination of such a maximum number of cells 104, while knowing the equivalent internal capacitance of each cell 106 (e.g., about 1 nF), allows for determination of an estimate of an equivalent internal capacitance for a cell stack having the maximum number of cells. Thus, the series inductance $L_R$ can be selected based on such a maximum equivalent internal capacitance $C_{EQ\_MAX}$ to effectively cancel, or otherwise minimize reactive power component at the ozone-producing cell 106 stack.

In at least some embodiments, the tank circuit 122 includes a selectable shunt capacitance $C_R$ provided in parallel with the one or more ozone-producing cells 106. In at least some embodiments, the capacitance value of capacitor $C_R$ can be chosen to compensate for variations in a number of ozone-producing cells 106 in a particular stack. For example, a capacitance value of the shunt capacitor $C_R$ can be chosen such that within an operating frequency range, a reactive load is approximately equal to the difference between the reactive load of the maximum number of ozone-producing cells 106 that the power system 100 can accommodate and a reactive load of the one or more ozone-producing cells 106 of the particular stack. Thus, a combination of the reactance of capacitor $C_R$ and the equivalent internal capacitors $C_{EQ}$ of the particular configuration of ozone-producing cells 106 can be maintained at approximately the same value, namely the maximum capacitance value $C_{EQ\_MAX}$. Selection of the series inductor $L_R$ can be chosen to effectively cancel the capacitive reactance of the combination of the shunt capacitor $C_R$ and the equivalent internal capacitance $C_{EQ}$ of the ozone-producing cells 106.

Figure 2:
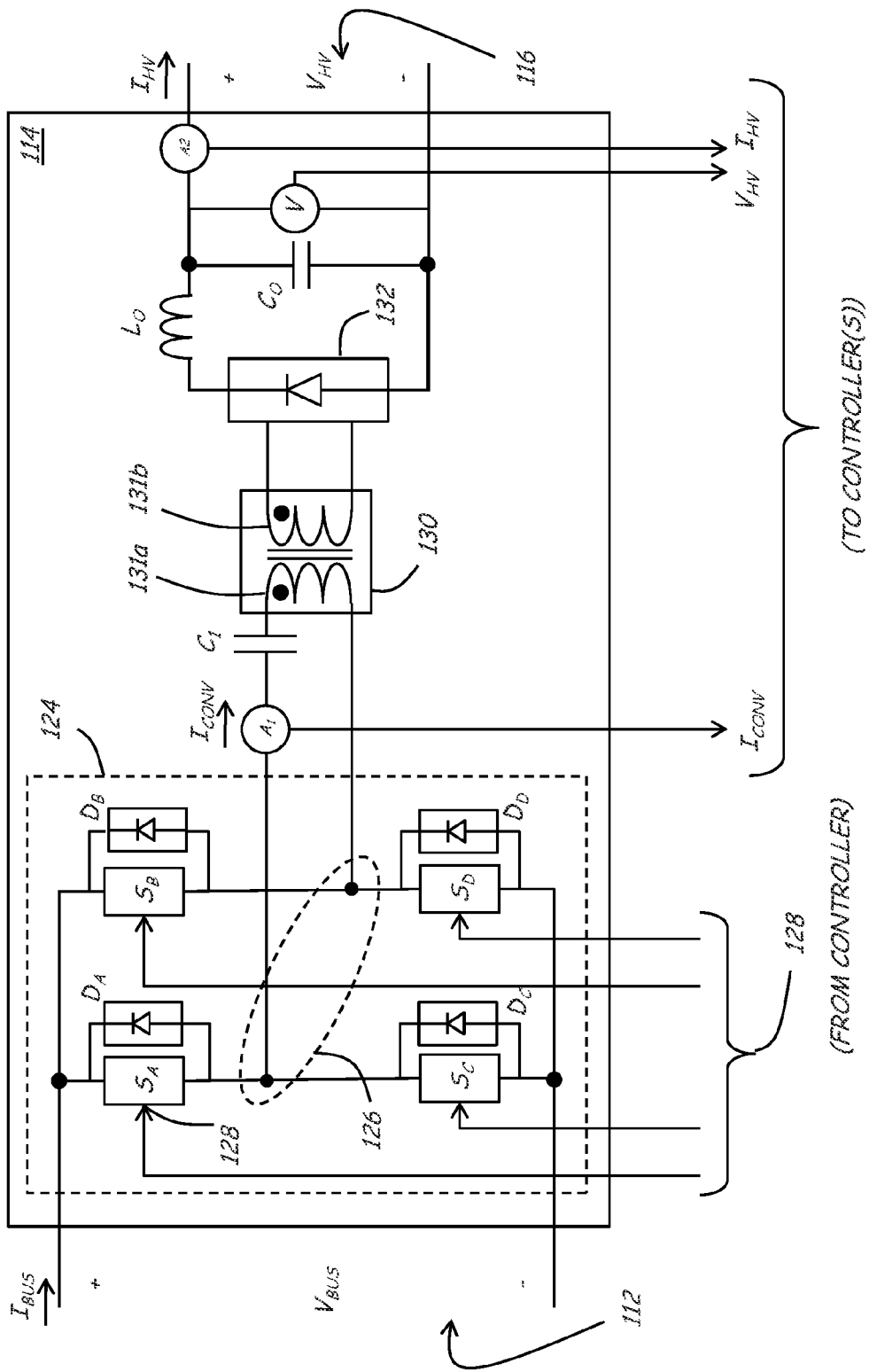
FIG. 2 shows a more detailed schematic diagram of an embodiment of a DC-to-DC power converter of the compact ozone power system shown in FIG. 1.

In more detail, at least one approach for implementing a DC-to-DC converter 114 is illustrated in FIG. 2. The DC-to-DC converter 114 includes a power inverter 124 for inverting the low-voltage, unregulated DC bus 112 into an alternating current (AC) by switching DC from the low-voltage, unregulated DC bus 112. An example of such an inverter 124 includes one or more switching, and control circuits that can be used to control a frequency of the switched DC (i.e., AC) voltage.

In at least some embodiments, the inverter 124 includes solid-state switching elements. The switched output of the inverter 124 can take various waveforms, such as a square wave, a modified sine wave and a pure sine wave. The inverter 124 can also take on various topologies. One such topology is known as a full-bridge or H-bridge inverter circuit, as shown. The full bridge circuit includes at least four semiconductor switches $S_A$, $S_B$, $S_C$, $S_D$ and anti-parallel diodes $D_A$, $D_B$, $D_C$, $D_D$. The input from the low-voltage, unregulated DC bus 112 is applied to a first opposing pair of terminals of the bridge (i.e., the top and bottom terminals), as shown. An AC output is obtained from a second opposing pair of terminals 126 of the bridge, as also shown. Each of the semiconductor switches $S_A$, $S_B$, $S_C$, $S_D$ can be controlled by a respective control input terminal 128. In at least some embodiments, each semiconductor switches $S_A$, $S_B$, $S_C$, $S_D$ is connected in parallel with a respective one of the diodes $D_A$, $D_B$, $D_C$, $D_D$. Thus, control of each switching element determines whether the respective diode is effectively "in" (switch open) or "out" (switch closed) of the bridge.

In at least some embodiments, a square wave AC rendition of the switched DC waveform described above can be obtained by pulse-width modulation (PWM) of one or more of the semiconductor switches $S_A$, $S_B$, $S_C$, $S_D$ of the inverter 124. Modulating, or regulating a width of a square-wave pulse by control of the control input terminals 128 can be used as a method of regulating or adjusting an inverter's output voltage. Such regulation is advantageous in maintaining delivery of DC under variations in one or more of source power 102 (FIG. 1) or load conditions.

Once converted to AC, the voltage level can be altered to virtually any desired voltage level by the use of a transformer. The illustrative DC-to-DC converter 114 includes such a transformer 130 having a primary winding 131a in communication with load terminals 126 of the inverter 124, driven by the switched DC voltage. A DC-blocking capacitor $C_1$ can be included in some embodiments, between one of the load terminals 126 and the transformer 130. In the illustrative example, the primary winding 131a of the transformer 130 has a respective number of turns about a magnetic core, and a secondary 131b winding also has a respective number of turns about the magnetic core. The magnitude of the output voltage can be determined, at least in part, by a ratio of the number of turns of the secondary winding 131b to the primary winding 131a. Thus, an output of the transformer obtained at the secondary winding 131b can be a high-voltage, or stepped-up rendition of the input obtained from the inverter 124. Beneficially, the transformer 130 also isolates a load, such as the one or more ozone-producing cells 106, from the external power source 102.

A physical size of magnetic elements of the power system 100, such as those used in the core of the transformer 130 is generally inversely proportional to a frequency of operation. Thus, the size of the transformer 130 of the DC-to-DC converter 114 can be reduced by operating the semiconductor switches $S_A$, $S_B$, $S_C$, $S_D$ of the full-wave inverter 124 at a relatively high frequency (e.g., as high as practical). In at least some embodiments, the semiconductor switches $S_A$, $S_B$, $S_C$, $S_D$ are operated at frequencies approaching a maximum switching frequency of the underlying semiconductor technology. For example, MOSFET switches can be operated at switching frequencies between about 300 kHz and about 600 kHz. As advances to semiconductor switching technologies allow for greater switching frequencies, such semiconductor switches can be applied to the circuits described herein, and in particular to power inverter circuits, such as the power converter 114, to allow for even greater switching frequency of operation to allow for further reduction in size for any magnetic components, such as the step-up transformer 130.

Other input power levels can be accommodated with the same system architecture described herein, or with minor modifications, depending upon the particular input power. For example, a 480 volt input application can be accommodated by reducing a turns ratio of the high-frequency transformer 130 to about half that used for a 208 volt input application. Additionally, some components, such as the switches $S_A$, $S_B$, $S_C$, $S_D$ and the diodes $D_A$, $D_B$, $D_C$, $D_D$ (FIG. 2) can be replaced, as necessary, with components having suitable voltage and/or current ratings. Once again, for a 480 volt input application, the switches and diodes of a 208 volt example embodiment can be replaced with higher voltage rating switches and diodes, preferably having the same footprint. Alternatively or in addition, rectifier diodes within the three-phase rectifier module 108 (FIG. 1) can also be replaced with higher voltage rated diodes, preferably having the same footprint. With such an approach, the rest of the circuit can generally be the same, regardless of input voltage.

It should be noted that switching at higher frequencies (e.g., 300-600 kHz or higher) also alleviates requirements on other components of the power system 100, such as any EMI power-line filters that might be included as described above. At least one class of semiconductor devices capable of switching at even greater frequencies is silicon carbide. Thus, it is understood that other high frequency semiconductor switching devices, such as silicon carbide devices, can be used to implement the switched $S_A$, $S_B$, $S_C$, $S_D$ to of the power inverter 124 to support even greater switching frequencies, allowing for even further reductions in the size of certain circuit components of the power converter 114. Beneficially, such reductions in one or more of component size, weight and heat loss realized by application of the various techniques described herein lend themselves to the construction of smaller, lighter, and more efficient power systems. In at least some embodiments, such power systems can be configured using no more than about one printed circuit board, or module. Such simplification realized by reducing the number of circuit boards or modules thereby reducing one or more of the power system's cost and complexity, while improving reliability. For example, a single board or module configuration precludes or otherwise minimizes the need for interconnecting cables or cable harnesses between multiple modules.

The stepped-up AC can be converted once again to a direct current, for example, by a rectifier 132, configured to rectify the AC of the secondary winding of the transformer 130, as shown. Such a rectifier 132 can be a half-wave rectifier, or a full-wave rectifier. The rectified AC output of the step-up transformer 130 can be filtered, for example, by one or more of a series inductor $L_O$ and a shunt capacitor $C_O$, to smooth the stepped-up DC output. Thus, an output of the power converter in response to the low-voltage, unregulated DC bus 112 input, powers a relatively high-voltage, regulated DC bus 116. For the 208 VAC input to the power system 100 described in the illustrative example of FIG. 1, the high-voltage DC bus 114 can have a value of at least about 1 kilovolts DC. Raising the relatively low-voltage DC bus (e.g., 200-350 volts DC) to a higher voltage (e.g., 1 kV) in this manner, also allows a tank circuit 122 (FIG. 1) having a relatively low "Q" (e.g., less than about 5) to sufficiently filter the square wave AC output 120 of the power inverter 118 (FIG. 1) to operate the one or more ozone-producing cells 106. Regulation of the supplied high-voltage DC bus 116 can be accomplished with one or more feedback control loops. For example, a measure of the high-voltage DC output voltage $V_{HV}$ can be provided to a control loop adapted to adjust operation of the full-bridge converter 114 to maintain the high-voltage DC output voltage within a tolerance (e.g., +/−10%) over a range of electrical loads (e.g., no load to full load). Operation of such a feedback control loop is described in more detail below.

Figure 3:
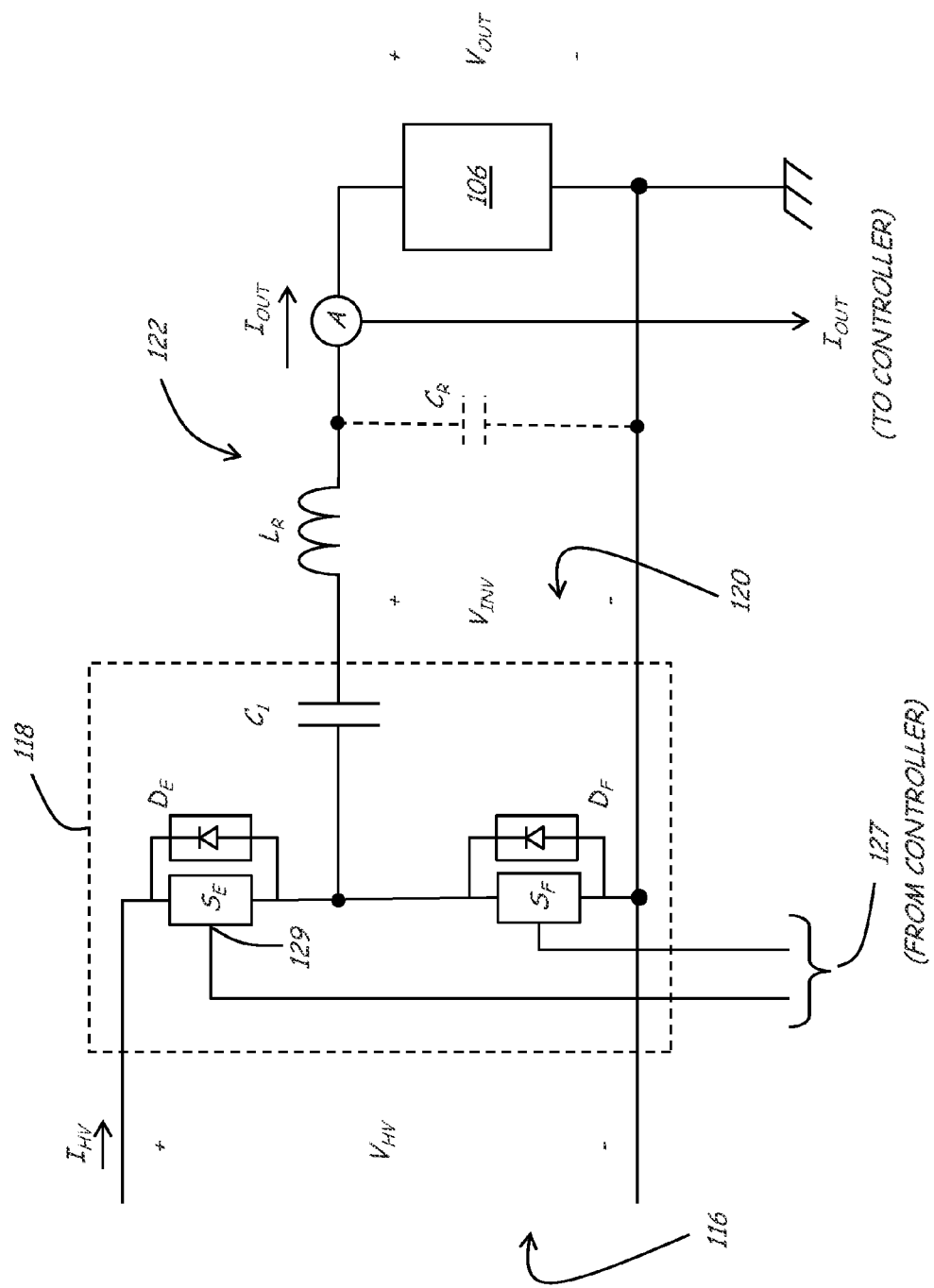
FIG. 3 shows a more detailed schematic diagram of an embodiment of a power inverter and tank circuit of the compact ozone power system shown in FIG. 1.

In at least some embodiments, the power inverter 118 includes a relatively high-voltage half-bridge inverter, as illustrated in FIG. 3. For example, the power inverter 118 can be adapted to switch the relatively high-voltage DC bus 116. The power inverter 118 can be similar to the power inverter 124 of the DC-to-DC converter 114 (FIG. 1), at least with respect to the use and control of semiconductor switching elements $S_E$, $S_F$ each shunting a respective diode $D_E$, $D_F$, as shown. Preferably, the switching elements $S_E$, $S_F$ of the power inverter 118 can be operated to produce a square wave having a frequency corresponding to a preferred operating frequency of the at least one ozone-producing cells 106. For example, a fundamental frequency of a square wave output of the power inverter 118 can be between about 20 kHz and about 40 kHz.

Figure 4:
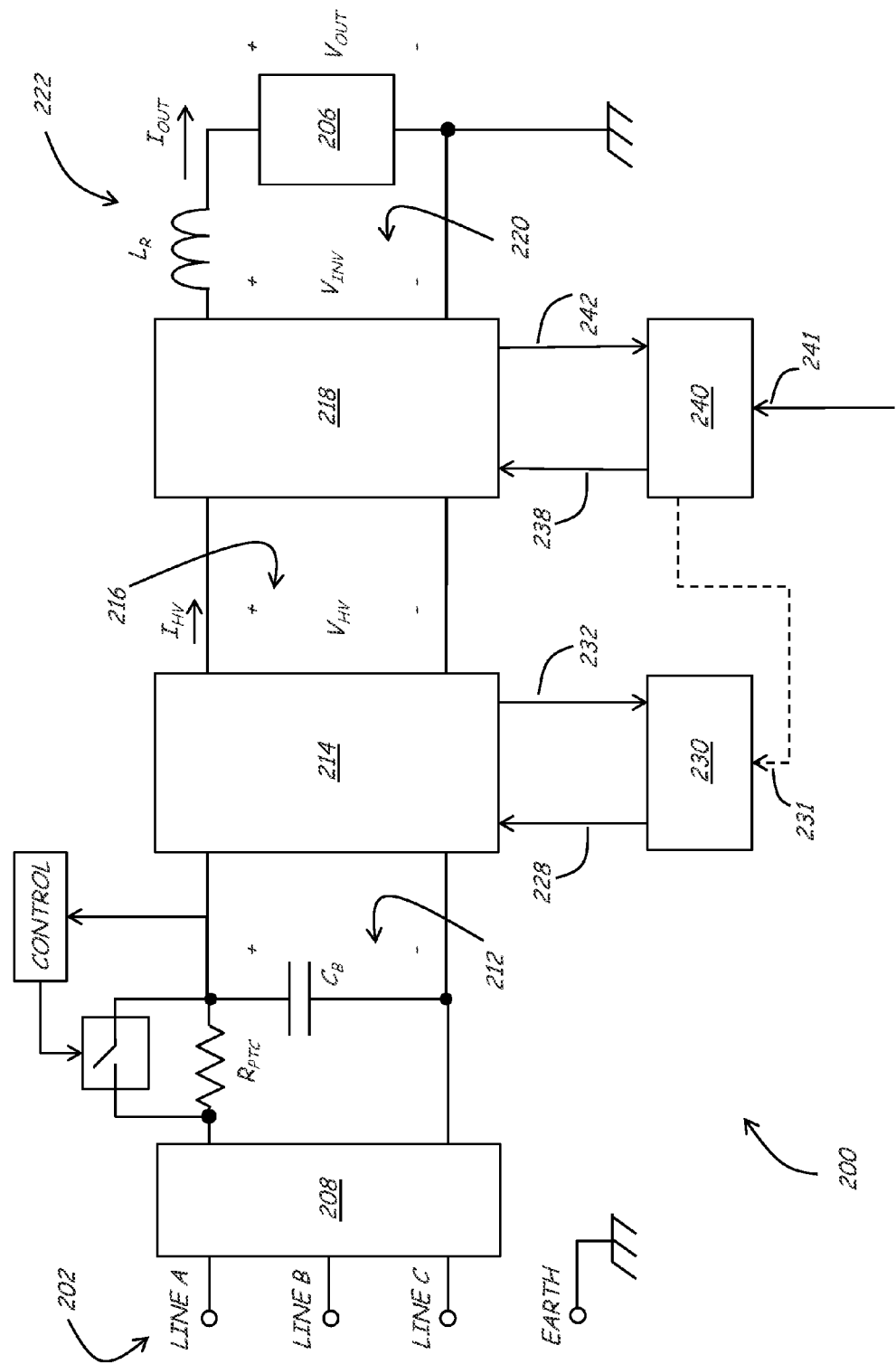
FIG. 4 shows a schematic diagram of an alternative embodiment of a modular ozone power system.

Referring next to FIG. 4, a schematic diagram of another embodiment of a modular ozone power system 200 is illustrated. Once again, the power system 200 receives electrical power from an external source 202, such as facility-provided power mains and converts the externally supplied power 202 to an electrical load power $V_{OUT}$, suitable for operating one or more ozone-producing cells 206. For applications in which facility supplied power 202 is AC, the power system 200 first includes a rectifier 208 for converting facility supplied AC to a DC voltage. The rectified output 208 is coupled across a filter capacitor, also referred to as a bus capacitor $C_R$. A voltage across the bus capacitor $C_R$ powers a DC bus 212.

The power system 200 also includes at least one power converter 214 having an input coupled to the low-voltage, unregulated DC bus 212. In at least some embodiments, the power converter 214 is configured as a DC-to-DC converter, providing an output that is also a DC voltage, but having a different value from the low-voltage, unregulated DC bus 212. For example, the power converter 214 can be configured to step up (i.e., increase) the relatively low voltage of the low-voltage, unregulated DC bus 212 to a relatively high, regulated DC voltage. An output of the power converter 214 can be coupled to a high-voltage, regulated DC bus 216. In at least some embodiments, a voltage of the regulate DC bus 216 is substantially greater than a voltage of the low-voltage, unregulated DC bus 212.

In at least some embodiments, the power system 200 further includes a power inverter 218, with an input coupled to the high-voltage, regulated DC bus 216. The power inverter 218 converts a voltage of the high-voltage, regulated DC bus 216 into a relatively high-frequency AC output 220. The relatively high-frequency AC output 220 is coupled to a resonant or tank circuit 222, formed by at least one resonant series inductor $L_R$ and the one or more ozone-producing cells 206. The series inductance $L_R$ forms, together with an internal capacitance of the one or more ozone-producing cells 206, a resonance in the high-frequency AC voltage. Preferably, the resonance $f_0$ occurs within a preferred operating frequency range of the at least one ozone-producing cell 206.

In at least some embodiments, the DC-to-DC converter 214 is substantially the same as illustrated and described above in relation to FIG. 2, having a controllable full-bridge power inverter. Similarly, in at least some embodiments, the power inverter 218 is substantially the same as illustrated and described above in relation to FIG. 3, having a controllable half-bridge power inverter. In at least some embodiments, the power system 200 includes a first controller 230 in communication with the DC-to-DC converter 214. The first controller 230 senses one or more electrical values 232 associated with the DC-to-DC converter 214. For example, the first controller 230 can receive from the DC-to-DC converter 214, one or more of an inverter current $I_{INV}$ (see FIG. 2), a high-voltage DC output $V_{HV}$ and an output current $I_{HV}$. In response thereto, the first controller 230 can provide switching control signals 228 to the one or more switches $S_A$, $S_B$, $S_C$, $S_D$ of the full bridge power inverter of the DC-to-DC converter 214. For example, the first controller 230 can include a phase-shift pulse width modulator that implements control of a full-bridge power stage by phase shifting the switching of one half-bridge with respect to the other. An example of such a device that can operate as either a voltage-mode or a current-mode controller, is part no. UCC3895, commercially available from Texas Instruments of Dallas, Tex. One particular form of switching is referred to as a modified phase-shift zero voltage switch (ZVS) pulse-width modulation (PWM) switching.

The power system 200 also includes a second controller 240 in communication with the power inverter 218. The second controller 240 senses one or more electrical values 242 associated with the power inverter 218. For example, the second controller 240 can receive from power inverter 218, an output current $I_{OUT}$ (see FIG. 3), the high-frequency AC output $V_{INV}$ 220. In response thereto, the second controller 240 can provide switching control signals 238 to one or more of the switches of the half bridge of the inverter 218. For example, the second controller 240 can also include a phase-shift, pulse width modulator that implements control of a half-bridge power stage by phase shifting the switching of one half-bridge. In at least some embodiments, part no. NCP1395, commercially available from On Semiconductor, San Jose, Calif., can be used in the second controller 240.

In at least some embodiments, at least one of the first and second controllers 230, 240 receives an external control input. For example, the second controller 240 has an input 241 for receiving a load power adjust setting (e.g., at a predetermined kilowatt rating, according to a particular application). Such a setting can be accomplished by a user-adjustable control, such as a knob, or by a configuration setting, such as an internal adjustment accomplished during an initial configuration or reconfiguration of the power system 200. In the illustrative embodiments, such an input can accommodate power ranging from less than about 1 kW up to 5 kW or greater. In the illustrative embodiment, the second controller 240 optionally provides an input 231 (shown in phantom) to the first controller 230. For example, a user-selected setting of the load power adjustment of the second controller 230 sets a power value delivered to the load (e.g., the one or more ozone-producing cells 206). In combination, the second controller provides an input to the first controller 230 resulting in variation of the DC high voltage bus in response to the user adjusted load power. Namely, a lower load power setting can be used to reduce a voltage level of the DC high voltage bus 216, such features allow for conservation of power and reduction of unnecessary wear and tear on components of the system.

Figure 5:
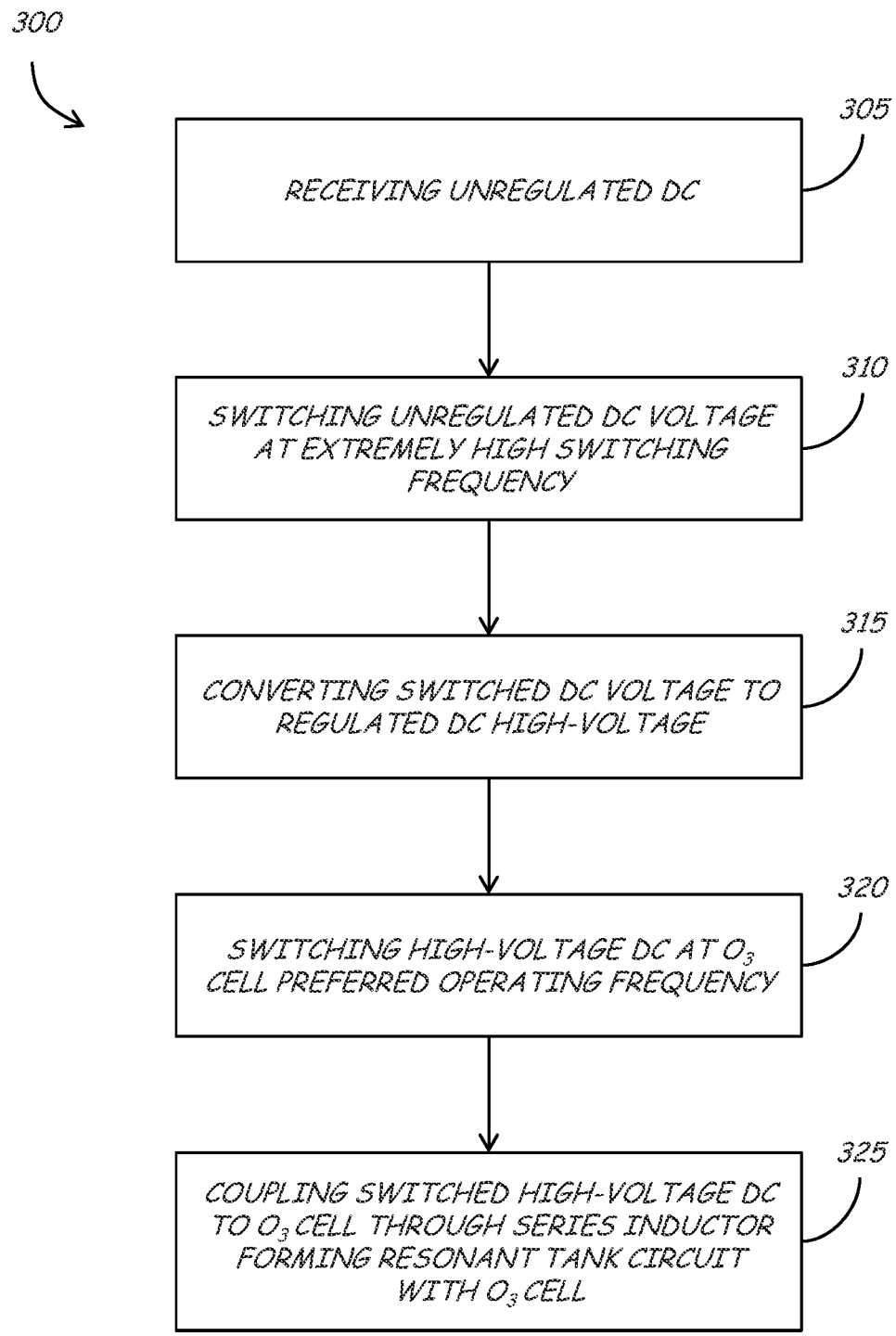
FIG. 5 shows a flow diagram of an embodiment of a process for supplying power to at least one ozone-producing cell.

FIG. 5 illustrates a flow diagram of an embodiment of a process 300 for supplying power to at least one ozone-producing cell. An unregulated DC voltage is received at 305. For example, the unregulated voltage can be received from a filtered output of a rectifier module 108, such as is provided in the power system 100 illustrated in FIG. 1. The unregulated DC is switched at an extremely high switching frequency at 310. For example, the unregulated DC is applied to a full-bridge power inverter, such as the full-bridge power inverter 124 illustrated in FIG. 2. The switched DC is converted to regulated DC high-voltage at 315. Such an increase in the DC voltage level can be accomplished, for example, by the step-up transformer 130 of the power converter 114 illustrated in FIG. 2. Regulation of the high-voltage DC can also be accomplished by adjusting switching control signals 128 from a power converter controller, such as the first controller 230 illustrated in FIG. 4. Thus, regulation of the DC high-voltage can be accomplished under a range of load conditions and under variations in source power 102. The high-voltage DC is switched at 320 at an ozone-producing cell preferred switching frequency. As described herein, such a preferred frequency is known to exist between about 20 kHz and about 40 kHz. Such switching can be accomplished by the power inverter 118, 218 (FIGS. 1 and 3). The switched high-voltage DC (e.g., a high-frequency square wave) is coupled at 325 to one or more ozone-producing cells 106 through a series inductor $L_R$ forming tank circuit with the one or more ozone-producing cells.

Referring once again to FIG. 1, at least some embodiments of the power system 100 include inrush current protection circuitry 140. In the illustrative example, the inrush current protection circuitry 140 includes a series resistance provided by a positive temperature coefficient thermistor, $R_{PTC}$, coupled between an output of the rectifier module 108 and one end of the bus capacitor $C_B$. Upon application of power to the power system 100 from the rectifier module 108 (i.e., during power up), the series resistance $R_{PTC}$ will control or otherwise limit the maximum current flowing into the bus capacitor $C_B$. The inrush current protection circuitry 140 also includes an active switch 142, configured in parallel with the series resistance $R_{PTC}$. The active switch 142 can include a controllable single-pole-single-throw switch, such as a switching transistor (e.g., a MOSFET) or a silicon-controlled rectifier (SCR).

The inrush current protection circuitry 140 also includes an inrush current controller 144. The inrush current controller 144 is configured for receiving an indication of one or more of the voltage across the bus capacitor $C_B$ (e.g., from voltage sensor V) and the current flowing from the rectifier 108 toward the bus capacitor $C_B$ (e.g., from current sensor A). The inrush current controller 144 is further configured or otherwise programmed to determine when the bus capacitor $C_B$ is charged, for example, above a predetermined threshold voltage. For example, such a threshold voltage can be identified as some percentage of a minimum acceptable bus operating voltage (e.g., 90% $V_{MIN}$). In some embodiments, the inrush current controller 144 provides a switch control signal to the controllable switch 142, causing the normally open switch to close, or otherwise short circuit the series resistance $R_{PTC}$. A substantial short circuit provided by the switch 142 effectively removes the series resistance from the circuit, allowing current to flow from the rectifier 108 towards the bus capacitor, in a substantially unrestricted manner. In at least some embodiments, the series resistor $R_{PTC}$ is generally known as a positive temperature coefficient thermistor. As such, the series resistor is configured to self-protect during operation should the active switch 142 happen to malfunction. Namely, the series resistor can increase its resistance value in response to current surges through the resistor to effectively control or otherwise limit any such current surges.

Figure 6:
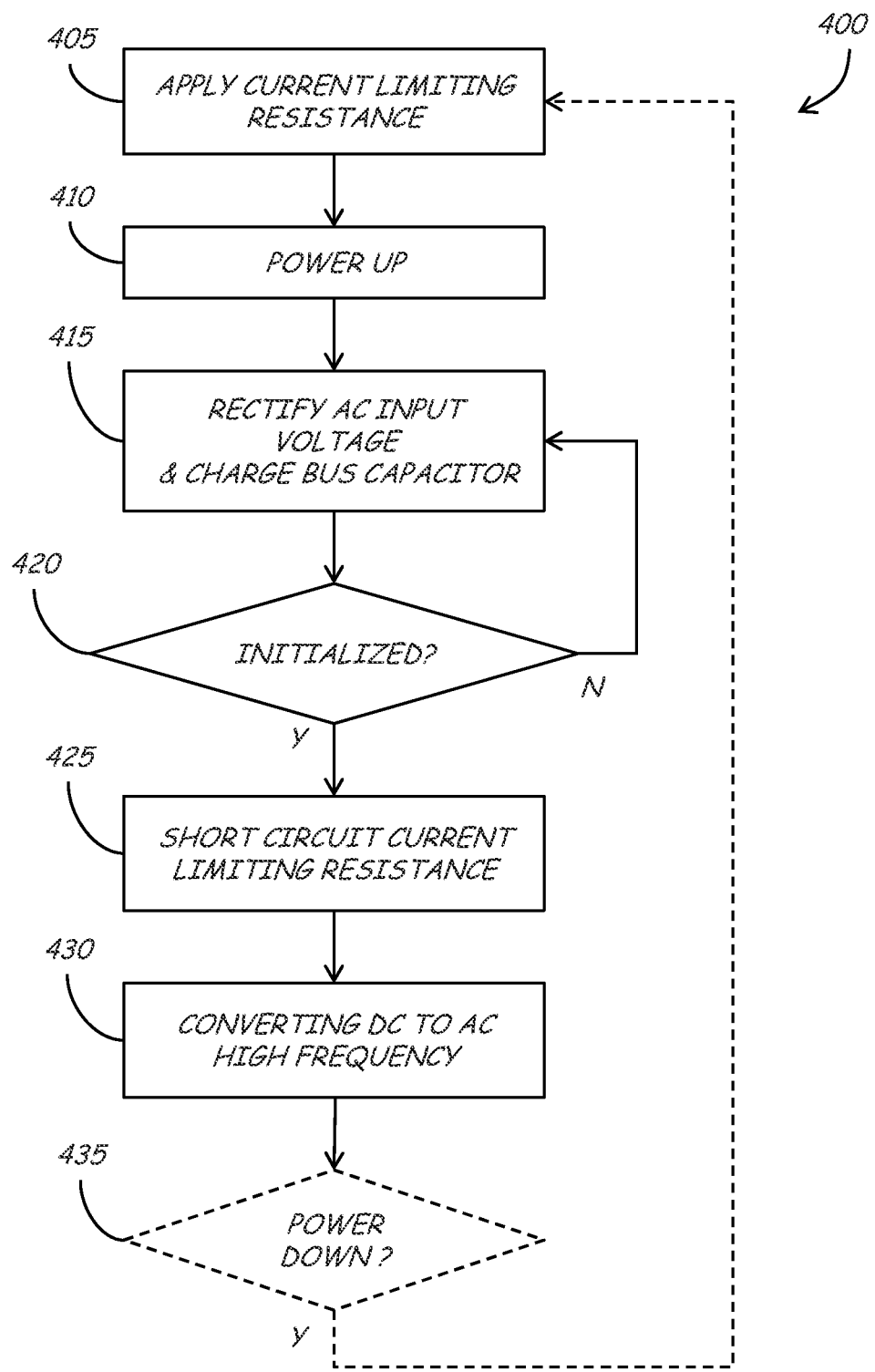
FIG. 6 shows a flow diagram of an embodiment of a process for supplying power to at least one ozone-producing cell.

A flow diagram of an embodiment of a process 400 for supplying power to at least one ozone-producing cell is illustrated in FIG. 6. A current limiting resistance, such as $R_{PTC}$ is initially applied at 405 (i.e., before power up) between an output of a rectifier module 108 of an ozone power system 100 and a bus capacitor $C_B$. Power is applied to the power system at 410. More particularly, an AC input voltage is applied to a bus capacitor at 415 for charging the bus capacitor $C_B$. The charging current flows through the current limiting resistor $R_{PTC}$. The bus capacitor $C_B$ is considered initialized when it has charged to a value above some threshold value. If the bus capacitor $C_B$ is not initialized at 420, the rectified AC input voltage continues charging bus capacitor at 415 through the series resistance $R_{PTC}$. If, however, the bus capacitor $C_B$ has been initialized at 420, the current limiting resistance can be short circuited or otherwise removed from the circuit at 425. A DC voltage established across the bus capacitor $C_B$ is converted by the power system 100 to high-frequency AC at 430, for powering an ozone-producing cell 106. In at least some embodiments, if the power system is powered down at 435, the current limiting resistance can be applied between the rectifier output and bus capacitor at 405 (e.g., by opening the switch 142), in anticipation of a subsequent power up.

Figure 7:
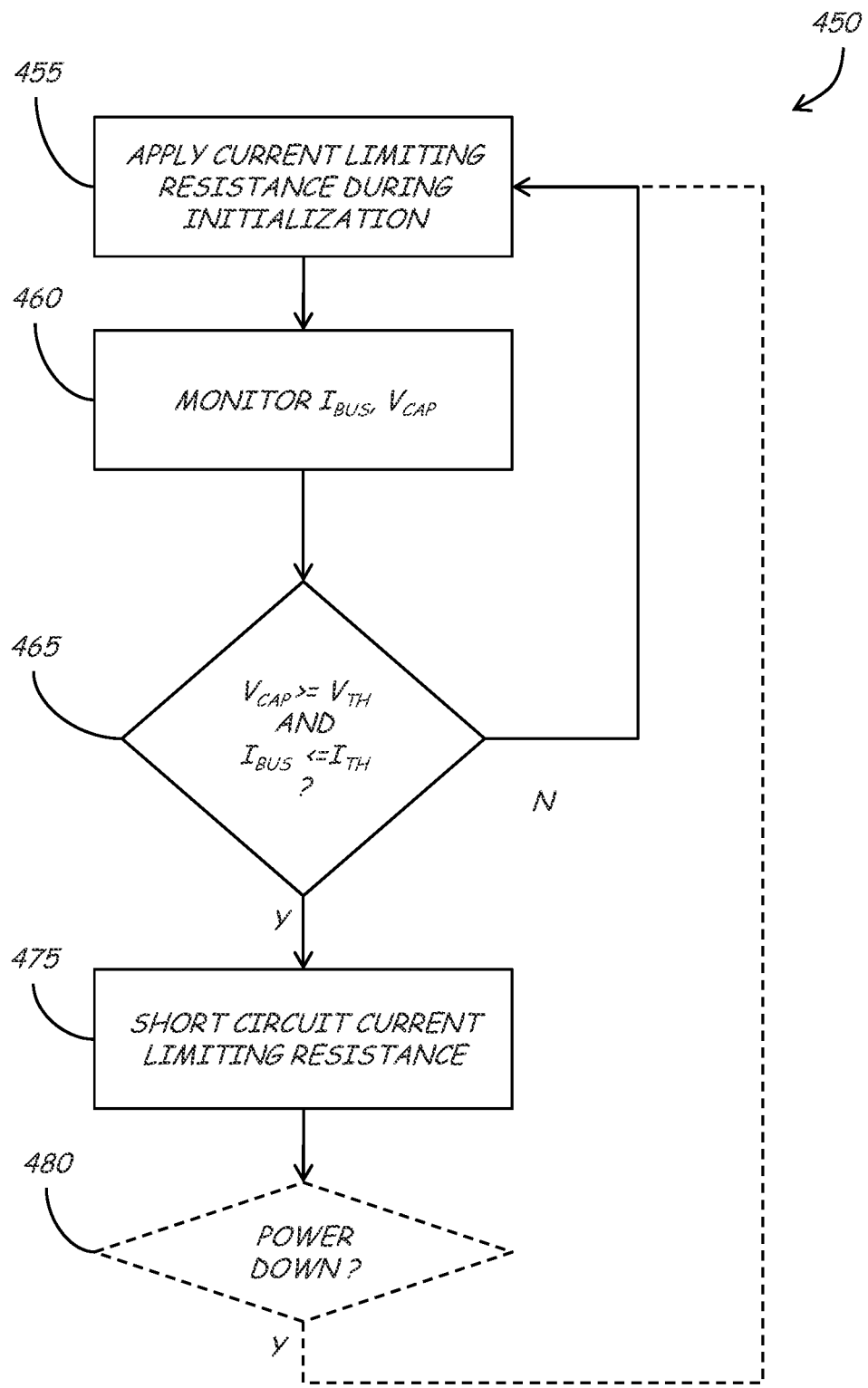
FIG. 7 shows a flow diagram of another embodiment of a process for supplying power to at least one ozone-producing cell.

Referring next to FIG. 7, a flow diagram 450 of another embodiment of a process for supplying power to at least one ozone-producing cell is illustrated. A current limiting resistance $R_{PTC}$ is applied between a rectifier module 108 and a bus capacitor $C_B$ during initialization at 455. A current $I_{BUS}$ flowing through the series resistance $R_{PTC}$, and a voltage $V_{CAP}$ across the bus capacitor $C_B$, are each measured at 460. If the bus voltage $V_{CAP}$ is less than a predetermined threshold voltage, $V_{TH}$, it is indicative that the bus capacitor $C_B$ has not been fully charged or otherwise initialized. Under this condition, the current-limiting resistance $R_{PTC}$ remains in place between the rectifier module 108 and the bus capacitor $C_B$ during initialization at 455 and monitoring $I_{BUS}$ and $V_{CAP}$ at 460. If the voltage $V_{CAP}$ is greater than or equal to the threshold voltage $V_{TH}$ at 465, however, it is next determined whether the current $I_{BUS}$ is greater than a predetermined current threshold $I_{TH}$. If the current remains above the current threshold $I_{TH}$, then application of the current limiting resistance $R_{PTC}$ continues during initialization at 455. During initialization, monitoring of the values $I_{BUS}$, $V_{CAP}$ also continues at 460, as well as the comparison of $V_{CAP}$ to $V_{TH}$ at 465. Once the voltage $V_{CAP}$ has increased above the threshold $V_{TH}$ and the current has fallen below the threshold $I_{TH}$, it can be concluded that the bus capacitor $C_B$ has been sufficiently charged. In response to this situation, the current limiting resistance $R_{PTC}$ is short-circuited or otherwise removed from the circuit at 475. In at least some embodiments, if the power system is powered down at 480, the current limiting resistance can be once again applied at 455, in anticipation for a subsequent power up.

Figure 8A:
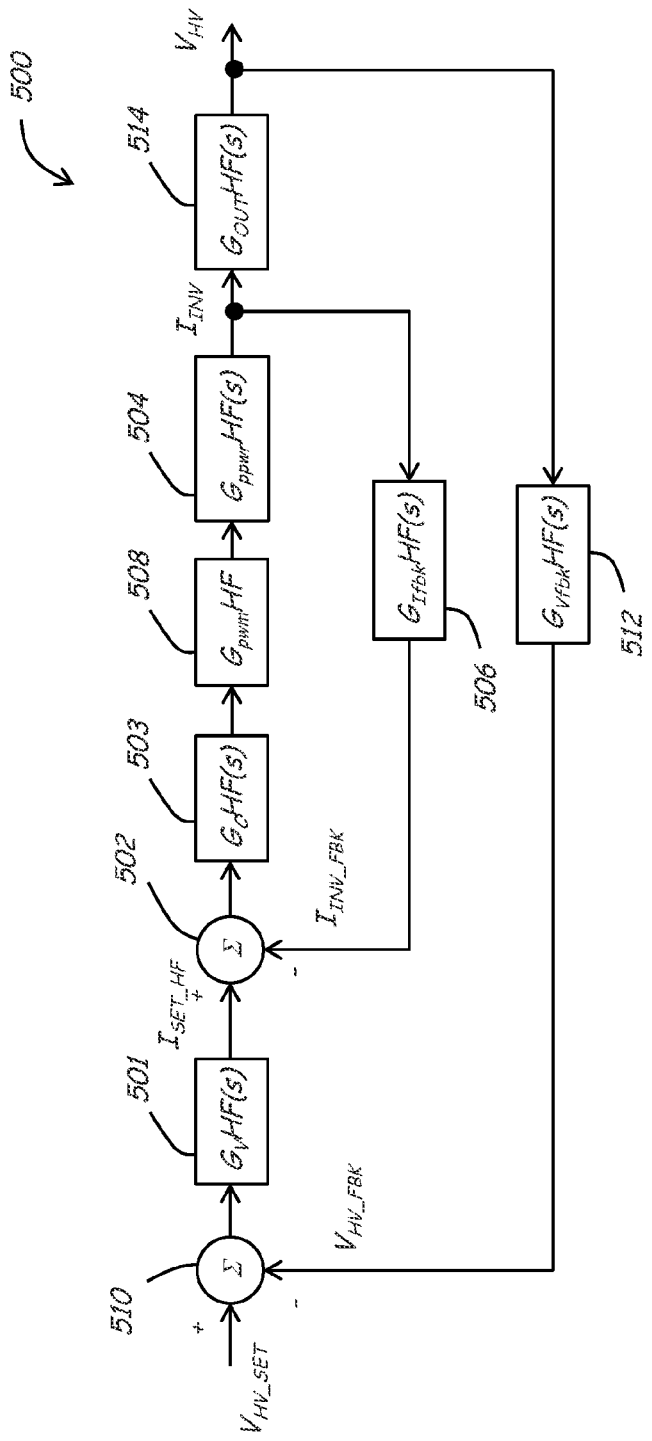
FIG. 8A shows a diagrammatic block diagram of an example of a feedback control loop associated with the first controller illustrated in FIG. 4.

FIG. 8A shows a schematic diagram of an example of a feedback control system 500 for varying switching operation of the power converter 114, 214 (FIGS. 2, 4), such that a high-voltage DC output of the DC-to-DC converter follows a reference. In at least some embodiments, at least a portion of the feedback control system is associated with application of the first controller 230 illustrated in FIG. 4. In a first, inner control loop, a difference is formed at a first summing network 502 between a target or reference switching current setting $I_{SET\_HF}$ at the primary winding of the transformer 130 (FIG. 2) and a measure of the actual switching current $I_{INV\_FBK}$ (e.g., feedback). The feedback can be obtained from a measurement of the switching current $I_{INV}$, for example by a first sensor, such as the current sensor $A_1$ shown in FIG. 2, or other suitable "pick-off" circuit. An output of the summing network 502 represents an error signal, determined as a difference between the reference $I_{SET\_HF}$ and feedback $I_{INV\_FBK}$ switching currents. The error signal can be conditioned (e.g., amplified), as necessary, by a conditioning network represented by a $G_C$HF(s) block 503. The conditioned error signal can be used to alter or otherwise adjust a switching control circuit, a transfer function of which is represented by the $G_{pwm}$HF block 508. The switched current is stepped up or down as required and otherwise conditioned, a corresponding transfer function being represented by a $G_{ppwr}$HF(s) block 504. A transfer function of any signal conditioning (e.g., amplification) as may be applied to the picked-off portion of the switching current, is represented by a $G_{Ifbk}$HF(s) block 506. Thus, the error current (i.e., $I_{SET\_HF}-I_{INV\_FBK}$) can be used to drive or otherwise change operation of the converter 124, 214 (FIGS. 2 and 4) to vary the switching current $I_{INV}$.

An example controller represented by the $G_{pwm}$HF block 508 provides a control signal adapted to adjust switching within the converter 124 to control the switching current $I_{INV}$, effectively closing the loop by zeroing a difference obtained at the summing node 502. Such control signals can be configured to impart one or more of pulse-width modulation and frequency modulation modes of operation of the switches $S_A$, $S_B$, $S_C$ and $S_D$. Thus the inner control loop operates to adjust the switching current $I_{INV}$ to match a received or reference switching current setting $I_{SET\_HF}$. In at least some embodiments, the controller 230 provides a pulse width modulation signal to the converter 124, thereby controlling the resulting switching current $I_{INV}$. A settling time in which the inner loop stabilizes after perturbation can be represented by the value $T_1$.

In a second, outer control loop, a difference is formed at a second summing network 510 between an input or reference high-voltage $V_{HV\_SET}$, indicative of an intended voltage setting for the high-voltage DC bus 216 (FIG. 4) and an indication of the actual voltage setting (e.g., feedback) for the high-voltage DC bus 216, $V_{HV\_FBK}$. The feedback can be obtained from a measurement of the high-voltage DC bus voltage, for example, by a suitable sensor or other suitable pick-off circuit, such as the voltage sensor V shown in FIG. 2. The outer control loop also includes a $G_{Vfbk}$HF(s) block 512, representing a transfer function of any signal conditioning circuitry, such as one as or more of signal gain and filtering, as may be applied to the measured high-voltage DC bus voltage $V_{HF}$. A $G_{OUT}$HF(S) block 514 represents a transfer function of any circuitry provided between that point at which the converter current $I_{INV}$ is sampled and the pick-off point of $V_{HF}$.

An output of the second summing network 510 represents an error signal determined as a difference between the reference high-voltage and the fed back sample of the high-voltage DC bus (i.e., $V_{HV\_SET}-V_{HV\_FBK}$). The error signal can be conditioned as required to produce a signal corresponding to the target or reference switching current setting $I_{SET\_HF}$. A $G_V$HF(S) block 501 represents a transfer function of any such circuitry. Thus, the error voltage can be used to drive or otherwise change operation of the converter 124, 214 (FIGS. 2 and 4) to vary the switching current $I_{INV}$, resulting in a desired change to the high-voltage DC voltage $V_{HF}$.

A settling time in which the outer loop stabilizes after perturbation can be represented by a time value $T_2$. Similarly, a settling time for the inner loop can be represented by a time value $T_1$. In at least some embodiments, the inner loop provides a faster response time than the outer control loop, such that $T_1 < T_2$. In at least some embodiments, the value of $T_2$ can be several times the value of $T_1$. In at least some embodiments, the value of $T_2$ can be at least about ten times greater than the value of $T_1$.

Figure 8B:
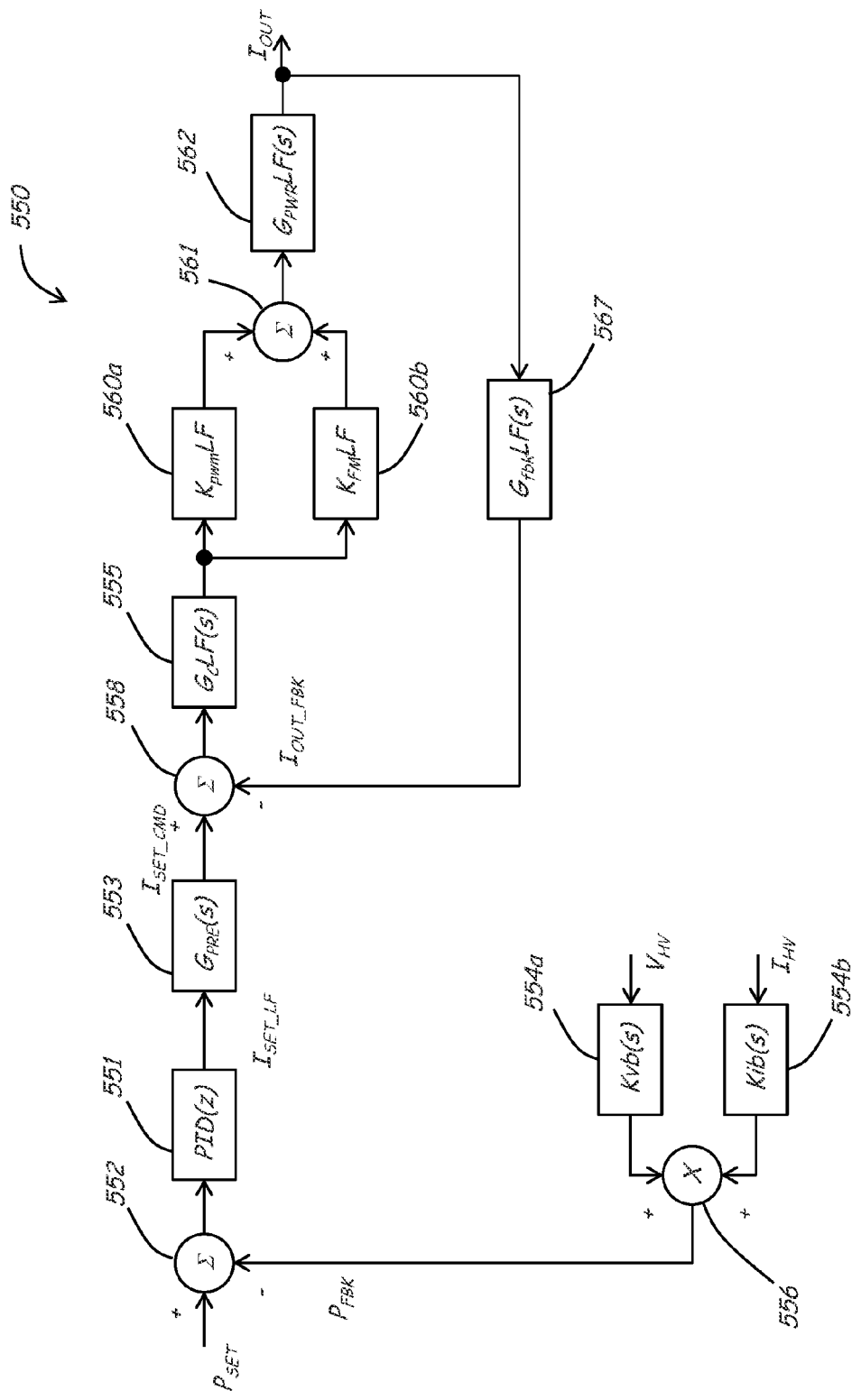
FIG. 8B shows a diagrammatic block diagram of an example of a feedback control loop associated with the second controller illustrated in FIG. 4.

FIG. 8B shows a schematic diagram of an example of a second feedback control system 550 for varying switching operation of the power inverter 118, 218 (FIGS. 2, 4), such that an output current $I_{OUT}$ of the power converter 100, 200 (FIGS. 1, 4) follows an adjustable reference current. In at least some embodiments, at least a portion of the second feedback control system 550 is associated with the second controller 240 illustrated in FIG. 4. In a first feedback loop, a difference is formed at a first summing network 558 between a target or reference load current setting $I_{SET\_CMD}$ and a measure (i.e., feedback) $I_{OUT\_FBK}$ of the actual power converter output current $I_{OUT}$. The measure of the output current $I_{OUT\_FBK}$ can be determined by a sensor (e.g., current sensor A shown in FIG. 3, or other suitable "pick-off" circuit) measuring the output current $I_{OUT}$. An output of the first summing network 558 represents an error signal, determined as a difference between the reference $I_{SET\_CMD}$ and feedback $I_{OUT\_FBK}$ currents. The error signal can be conditioned (e.g., amplified), as necessary, by a conditioning network, a transfer function of which is represented by a $G_C$LF(s) block 555.

The conditioned error signal can be used to alter or otherwise adjust a switching control circuit, such as a switching circuit $S_E$, $S_F$ of the power inverter 118, 218. The switching control circuit determines operation of the switching circuit $S_E$, $S_F$ to produce a desired switched output current. In at least some embodiments more than one switching control circuits can be provided, such as a pulse width modulation circuit, the transfer function of which is represented by the $K_{pwm}LF$ block 560a, and a frequency modulation circuit, the transfer function of which is represented by the $K_{fm}LF$ block 560b. Output signals from each of the switching control circuits can be combined in a combining network 561. The switched current can be filtered and conditioned as otherwise required, a corresponding transfer function being represented by the $G_{PWR}LF(s)$ block 562. A transfer function of any signal conditioning (e.g., amplification) as may be applied to the picked-off portion of the switching current, is represented by the $G_{Ifbk}LF(s)$ block 567. Thus, the error current (i.e., $I_{SET\_CMD}$ $I_{OUT\_FBK}$) can be used to drive or otherwise change operation of the inverter 118, 218 (FIGS. 2 and 4) to vary the power converter output current $I_{OUT}$.

In some embodiments, a second feedback loop is provided to control the reference load current setting $I_{SET\_CMD}$. In particular, the second control loop operates according to a power level of the power converter 100, 200. Namely, the output power follows an adjustable reference power level $P_{SET}$. In an example embodiment, a difference or error signal is formed at a second summing network 552 between target or reference load power setting $P_{SET}$ (e.g., 0 kW<$P_{SET}$<5 kW) and a measure of the actual output power $P_{FBK}$ (e.g., feedback). The indication of the actual output power can be determined or otherwise estimated as a product of the output voltage $V_{HV}$ and output current $I_{HV}$, each measurable at an output of the DC-to-DC converter 114, 214 (FIGS. 2 & 4). A product can be obtained by applying each sensed output to a multiplication circuit 556. For example, the output voltage $V_{HV}$ can be obtained by a first sensor, such as the voltage sensor V shown in FIG. 2. Likewise, the output current $I_{HV}$ can be obtained by a second sensor, such as the current sensor $A_2$ shown in FIG. 2. Alternatively or in addition, a measure of the input voltage $V_{BUS}$ and input current $I_{BUS}$ can be used as an alternative approach to estimating the actual output power $P_{FBK}$. The $K_{vb}(s)$ block 554a represents a transfer function of circuitry between the sampled output voltage $V_{HV}$ and the multiplication circuit 556. Likewise, the $K_{ib}(s)$ block 554b represents a transfer function of circuitry between the sampled output current $I_{HV}$ and the multiplication circuit 556.

An output of the second summing network 552 represents an error signal, determined as a difference between the reference $P_{SET}$ and feedback $P_{FBK}$ power levels. The error signal can be modified or otherwise conditioned as necessary (e.g., proportionality, integration, differentiation) represented by a PID(z) block 551, to convert a measure of power to a measure of current $I_{SET\_LF}$. In at least some embodiments the modified power error signal is further conditioned (e.g., amplified), as necessary, by a conditioning network represented by a $G_{PRE}(s)$ block 553 (e.g., a pre-amplifier).

A settling time in which the outer loop stabilizes after perturbation can be represented by a time value $T_4$. Similarly, a settling time for the inner loop can be represented by a time value $T_3$. In at least some embodiments, the inner loop provides a faster response time than the outer control loop, such that $T_3<T_4$. In at least some embodiments, the inner control loop of the second feedback control system 550 provides a slower response time (e.g., settling time $T_3$) then either of the inner and outer control loops of the first feedback control system 500 (i.e., $T_3>T_2>T_1$).

Figure 8C:
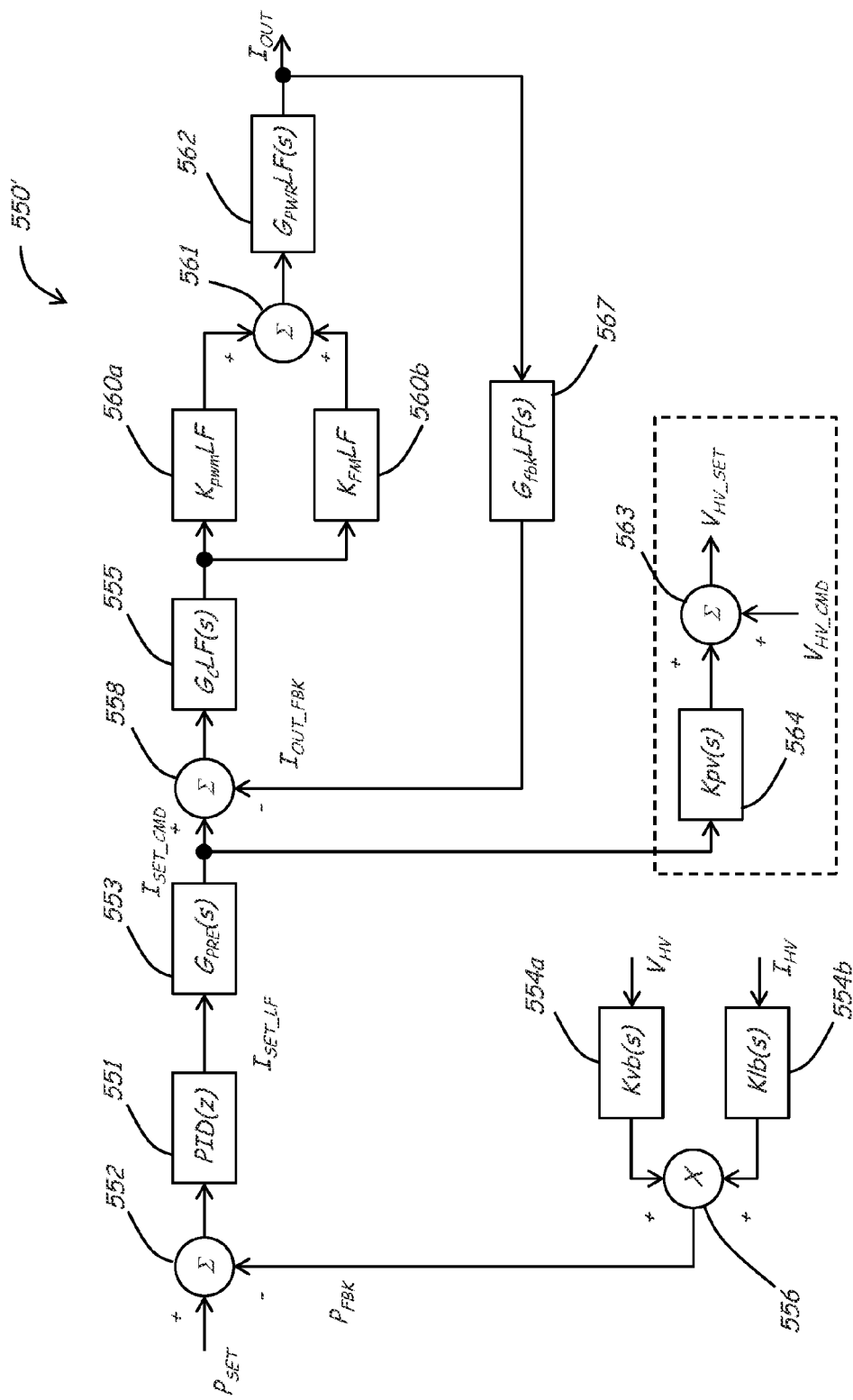
FIG. 8C shows a diagrammatic block diagram of an example of an alternative embodiment of a feedback control loop associated with the second controller illustrated in FIG. 4.

FIG. 8C shows a schematic diagram of an alternative embodiment of the second feedback control system 550' including a link to the first control system 500. In the linked controller of the illustrative embodiment, a difference or error signal is formed at a third summing network 563 between a target or reference high-voltage DC $V_{HV\_CMD}$ and a reference input to the first summing network 558 (e.g., feedback). An output of the third summing network 563 $V_{HV\_SET}$ is provided as an input to the second summing network 510 of the first control loop 500 (FIG. 8A) for establishing a voltage level of the high-voltage regulated DC bus 216 (FIG. 2). Namely, a sample of the target load current setting $I_{SET\_CMD}$ can be modified by circuitry, a transfer function represented by a $k_{pv}(s)$ block 564, and combined with a received high-voltage setting command $V_{HV\_CMD}$ to produce a target high-voltage DC bus setting $V_{HV\_SET}$. The settling time of this linked control loop is the slowest out of the others. Consequently, the settling time of the linked control loop prevents interaction among all of the other control loops.

Beneficially, increased power stage efficiency can be realized due to an ability to lower an operating value of the high-voltage bus when output power demands are relatively low. Another benefit is improved reliability, since reduced voltage stress occurs when the high-voltage bus is lowered.

In at least some embodiments, the power system 100 is configured to provide power to any combination of ozone-producing cells 106 between about 0 watts to about 5 kilowatts. One or more such power systems 100, 200 can also be combined (e.g., in parallel) to provide greater power to one or more ozone-producing cells 106, 206 than any single power system 100, 200 would otherwise be capable of providing.

Whereas many alterations and modifications of the present disclosure will no doubt become apparent to a person of ordinary skill in the art after having read the foregoing description, it is to be understood that the particular embodiments shown and described by way of illustration are in no way intended to be considered limiting. For example, although the control loops are described in the context of analog operation, it is understood that one or more of the loops can also be implemented as a digital controller. Further, the disclosure has been described with reference to particular preferred embodiments, but variations within the spirit and scope of the disclosure will occur to those skilled in the art. It is noted that the foregoing examples have been provided merely for the purpose of explanation and are in no way to be construed as limiting of the present disclosure.

While the present disclosure has been described with reference to exemplary embodiments, it is understood that the words, which have been used herein, are words of description and illustration, rather than words of limitation. Changes may be made, within the purview of the appended claims, as presently stated and as amended, without departing from the scope and spirit of the present disclosure in its aspects.

Although the present disclosure has been described herein with reference to particular means, materials and embodiments, the present disclosure is not intended to be limited to the particulars disclosed herein; rather, the present disclosure extends to all functionally equivalent structures, methods and uses, such as are within the scope of the appended claims.

We claim:
1. A method for supplying power to at least one ozone-producing cell, comprising:
   receiving an unregulated DC voltage;
   switching the unregulated DC voltage at a first switching frequency;

converting the switched DC voltage to a regulated, DC high voltage, substantially greater than the unregulated DC voltage;

switching the DC high voltage at a second switching frequency within a preferred operating frequency range of the at least one ozone-producing cell;

coupling the switched DC high voltage to the at least one ozone-producing cell through a series inductance, the series inductance forming together with an internal capacitance of the at least one ozone-producing cell, a resonance adapted to subject the at least one ozone-producing cell to a narrow-band, AC high voltage within the preferred operating frequency range of the ozone-producing cell; and providing a load power adjustment signal for setting a value of power to be delivered to the at least one ozone-producing cell, the load power adjustment signal being used to alter a voltage level of the DC high voltage.

2. The method of claim 1, wherein the DC high voltage is between about 1 kV and about 2 kV, for the unregulated DC voltage obtained by rectification of utility-provided AC power.

3. The method of claim 1, wherein converting the switched DC voltage to a regulated, DC high voltage comprises applying the switched DC voltage to a primary winding of a step-up transformer, a physical size of the step-up transformer being inversely proportional to the first switching frequency.

4. The method of claim 1, wherein the first switching frequency is greater than about 300 kHz.

5. The method of claim 1, wherein the preferred operating frequency range of the ozone-producing cell is between about 20 kHz and about 40 kHz.

6. The method of claim 5, wherein the AC high voltage is about 8 kV peak-to-peak.

7. The method of claim 6, wherein a Q resulting from the series inductance and the internal capacitance of the at least one ozone-producing cell is less than about 5.

8. The method of claim 1, wherein switching one or more of the unregulated DC voltage and the DC high voltage comprises phase shift zero voltage switch pulse width modulation.

9. The method of claim 8, further comprising switching one or more of the unregulated DC voltage and the DC high voltage responsive to a predetermined power for driving the at least one ozone-producing cell.

10. The method of claim 1, further comprising adjusting the DC high voltage respective to an adjustable output power.

11. The method of claim 1, wherein providing a load power adjustment signal comprises a user manually providing the load power adjustment signal.

12. A power converter for energizing at least one ozone-producing cell comprising:

a DC-to-DC converter having an input configured to receive an unregulated DC voltage and an output configured to provide a regulated DC high voltage derived from the unregulated DC voltage, the DC high voltage having an amplitude substantially greater than an amplitude of the unregulated DC voltage;

a high-frequency power inverter having an input in communication with the output of the DC-to-DC converter, the high-frequency power inverter configured to provide at an output a high-frequency AC voltage derived from the DC high voltage;

a series inductance coupled between the output of the high-frequency power inverter and at least one ozone-producing cell, the series inductance forming together with an internal capacitance of the at least one ozone-producing cell a resonance in the high-frequency AC voltage occurring within a preferred operating frequency range of the at least one ozone-producing cell; and an input for providing a load power adjustment signal for setting a value of power to be delivered to the at least one ozone-producing cell, the load power adjustment signal being used to alter the amplitude of the DC high voltage based on the power to be delivered to the at least one ozone-producing cell.

13. The power converter of claim 12, wherein the DC high voltage is between about 1 kV and about 2 kV, for the unregulated DC voltage obtained by rectification of utility-provided AC power.

14. The power converter of claim 12, wherein each of the DC-to-DC converter and the high-frequency power inverter comprises a respective plurality of controllable switches, each plurality of controllable switches operated at a respective switching frequency.

15. The power converter of claim 14, wherein the DC-to-DC converter comprises a step-up transformer having a physical size selected in inverse proportion to the respective switching frequency of the respective plurality of controllable switches.

16. The power converter of claim 15, wherein the respective switching frequency of the plurality of controllable switches of the DC-to-DC converter is greater than about 300 kHz.

17. The power converter of claim 12, further comprising:

a first controller having a sensing input receiving an indication of the DC high voltage output of the DC-to-DC converter, a reference input configured to receive an indication of a target DC high voltage, and a controlling output in communication with the DC-to-DC converter, the first controller configured to adjust operation of the DC-to-DC converter responsive to the target DC high voltage and an indication of the DC high voltage received at the sensing input; and a second controller having a sensing input configured to receive an output indication of at least one of a load voltage and a load current supplied to the at least one ozone-producing cell, a reference power input configured to receive an indication of operating load power, and a controlling output in communication with the high frequency power inverter, the second controller configured to adjust operation of the high-frequency power inverter responsive to the received indication of operating load power and an indication of the at least one of the load voltage and the load current.

18. The power converter of claim 17, wherein the second controller comprises a target DC high voltage output in communication with the reference input of the first controller.

19. The power converter of claim 17, wherein at least one of the first and second controllers comprises a phase-shift, zero-voltage switch pulse width modulator.

20. The power converter of claim 12, wherein the preferred operating frequency of the ozone-producing cell is between about 20 kHz and about 40 kHz.

21. The power converter of claim 12, further comprising a shunt capacitance coupled in parallel to the at least one ozone-producing cell, a value of the shunt capacitance selectable to offset internal capacitance of added or removed ozone-producing cells, thereby preserving a substantially constant reactive load to the power converter.

22. The power converter of claim 12, wherein the load power adjustment signal can be manually provided via the input by a user.

23. A method for supplying power to at least one ozone-producing cell, comprising:
- converting an unregulated DC voltage to a regulated DC high voltage having an amplitude substantially greater than an amplitude of the unregulated DC voltage;
- controlling conversion of the unregulated DC voltage to the regulated DC high voltage responsive to a DC high voltage reference input;
- converting the DC high voltage to a high-frequency AC voltage;
- controlling conversion of the DC high voltage to the high-frequency AC voltage responsive to a load power reference input, such that electrical power delivered by the high-frequency AC voltage, when applied through a series inductance to at least one ozone-producing cell, corresponds to the load power reference input; and
- providing a load power adjustment signal for setting a value of power to be delivered to the at least one ozone-producing cell, the load power adjustment signal being used to alter a voltage level of the DC high voltage.

24. The method of claim 23, wherein the DC high voltage is between about 1 kV and about 2 kV, for the unregulated DC voltage obtained by rectification of utility-provided AC power.

25. The method of claim 23, wherein switching one or more of the unregulated DC voltage and the DC high voltage comprises phase shift zero voltage switch pulse width modulation.

26. The method of claim 23, wherein providing a load power adjustment signal comprises a user manually providing the load power adjustment signal.

* * * * *